United States Patent
Ito

(10) Patent No.: US 9,557,657 B2
(45) Date of Patent: Jan. 31, 2017

(54) EXPOSURE APPARATUS AND METHOD OF MANUFACTURING ARTICLE

(71) Applicant: CANON KABUSHIKI KAISHA, Tokyo (JP)

(72) Inventor: Satoru Ito, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 9 days.

(21) Appl. No.: 14/299,244

(22) Filed: Jun. 9, 2014

(65) Prior Publication Data
US 2014/0362357 A1    Dec. 11, 2014

(30) Foreign Application Priority Data
Jun. 10, 2013    (JP) .................................. 2013-122024

(51) Int. Cl.
G03B 27/32    (2006.01)
G03F 7/20    (2006.01)
G03F 9/00    (2006.01)

(52) U.S. Cl.
CPC ..... *G03F 7/70725* (2013.01); *G03F 2009/005* (2013.01)

(58) Field of Classification Search
CPC ............ G03F 2009/005; G03F 7/70725; G03F 9/7049
See application file for complete search history.

(56) References Cited

U.S. PATENT DOCUMENTS 5,473,412 A * 12/1995 Ozawa ................ G03F 7/70058
                                                 355/53
5,483,311 A * 1/1996 Sakakibara ......... G03F 7/70241
                                                 355/53

(Continued)

FOREIGN PATENT DOCUMENTS

CN    101221363 A    7/2008
JP    09-199386 A    7/1997

(Continued)

OTHER PUBLICATIONS

Chinese Office Action issued in counterpart application No. CN201410245805.2, dated Nov. 2, 2015. English translation provided.

(Continued)

*Primary Examiner* — Deoram Persaud
(74) *Attorney, Agent, or Firm* — Rossi, Kimms & McDowell LLP

(57) ABSTRACT

The present invention provides an exposure apparatus which exposes each of a plurality of shot regions on a substrate, comprising a substrate stage configured to be movable while holding the substrate, and a control unit, wherein the plurality of shot regions include a first shot region, and a second shot region which is exposed next to the first shot region, and the control unit drives the substrate stage in accordance with drive information of the substrate stage in a period until exposure of the second shot region starts after an end of exposing the first shot region, and when an exposure condition for exposing the second shot region is not satisfied in the period, the control unit drives again the substrate stage in accordance with the drive information and then exposes the second shot region.

17 Claims, 8 Drawing Sheets

(56) References Cited

U.S. PATENT DOCUMENTS

| | | | | |
|---|---|---|---|---|
| 5,617,182 | A * | 4/1997 | Wakamoto | G03F 7/70358 355/51 |
| 5,677,754 | A * | 10/1997 | Makinouchi | G03F 7/70066 355/50 |
| 5,995,203 | A * | 11/1999 | Ueda | G03F 7/70358 355/53 |
| 6,236,447 | B1 * | 5/2001 | Yamada | G03F 9/7034 355/53 |
| 6,277,533 | B1 * | 8/2001 | Wakamoto | G03F 7/70358 355/77 |
| 6,646,715 | B1 * | 11/2003 | Makinouchi | G03B 27/42 355/53 |
| 8,625,072 | B2 | 1/2014 | Sato | |
| 9,001,306 | B2 | 4/2015 | Sato | |
| 2001/0000974 | A1 | 5/2001 | Hazelton et al. | |
| 2005/0103260 | A1 * | 5/2005 | Lee | G03F 7/70358 117/103 |
| 2006/0082747 | A1 * | 4/2006 | Fukuhara | G03B 27/42 355/53 |
| 2011/0273686 | A1 * | 11/2011 | Sato | G03B 27/42 355/53 |
| 2012/0170008 | A1 | 7/2012 | Emoto et al. | |

FOREIGN PATENT DOCUMENTS

| | | | |
|---|---|---|---|
| JP | 2010272673 A | 12/2010 | |
| JP | 2011-238707 A | 11/2011 | |
| KR | 1020110123665 A | 11/2011 | |

OTHER PUBLICATIONS

Office Action issued in Korean Appln. No. 10-2014-0069354 mailed Aug. 15, 2016.

* cited by examiner

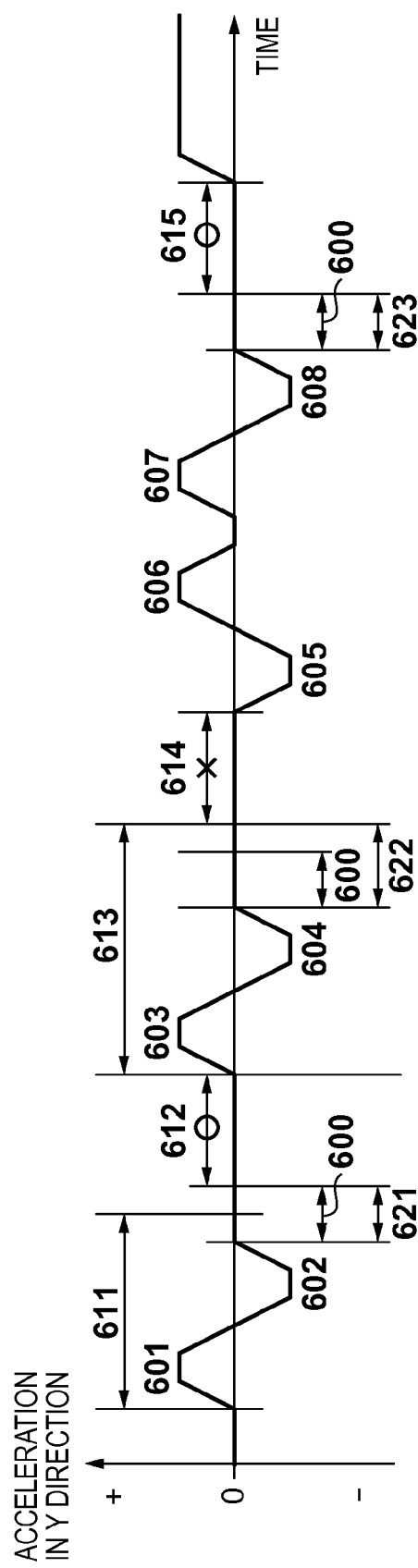

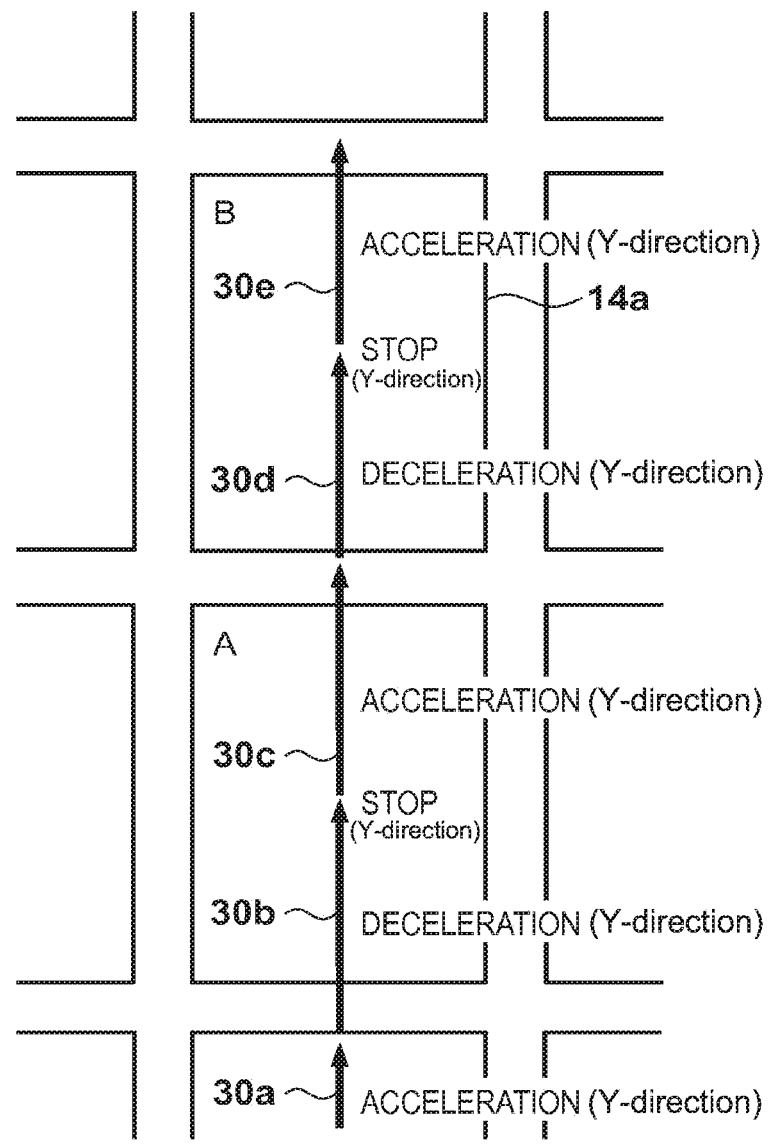

EXPOSURE APPARATUS AND METHOD OF MANUFACTURING ARTICLE

BACKGROUND OF THE INVENTION

Field of the Invention

The present invention relates to an exposure apparatus and a method of manufacturing an article.

Description of the Related Art

One of apparatuses used in a manufacturing step (lithography step) for a semiconductor device or the like is an exposure apparatus which transfers the pattern of a mask onto a substrate. The exposure apparatus needs to accurately transfer the pattern of a mask onto a substrate. For this purpose, it is important to make the imaging plane (focus plane) of the projection optical system coincide with the substrate surface in the exposure apparatus. The exposure apparatus therefore performs focus measurement to measure the height of the substrate surface.

However, since a reaction force is generated along with acceleration or deceleration of the substrate stage in the exposure apparatus, the frame structure in the exposure apparatus is deformed and thereby an error in the result of focus measurement may be generated. It may become difficult to accurately transfer the pattern of a mask onto a substrate. Japanese Patent Laid-Open No. 9-199386 has proposed a method of measuring in advance the shift amount of an image projected on a substrate in accordance with the acceleration of a substrate stage, and when exposing the substrate, applying the shift amount as a correction value to the result of focus measurement. Japanese Patent Laid-Open No. 2011-238707 has proposed a method of obtaining in advance, as a correction value, the difference between results of focus measurement during acceleration and constant-speed movement of a substrate stage, and correcting, based on the correction value, the result of focus measurement during acceleration of the substrate stage.

In general, the exposure apparatus exposes a plurality of shot regions on a substrate while correcting the result of focus measurement based on a correction value obtained in advance in accordance with the acceleration of the substrate stage. However, a shot region (unexposed shot region) which has not been exposed because the exposure condition was not satisfied till the start of exposure may be generated among a plurality of shot regions. To increase the yield, even the unexposed shot region needs to be exposed. When exposing the unexposed shot region, a correction value obtained in advance is desirably applied. Therefore, when exposing the unexposed shot region, the substrate stage should be driven in the same way as that when a plurality of shot regions were exposed in order.

SUMMARY OF THE INVENTION

The present invention provides an exposure apparatus advantageous for accurately transferring the pattern of a mask onto a substrate.

According to one aspect of the present invention, there is provided an exposure apparatus which exposes each of a plurality of shot regions on a substrate, comprising: a substrate stage configured to be movable while holding the substrate; and a control unit, wherein the plurality of shot regions include a first shot region, and a second shot region which is exposed next to the first shot region, and the control unit drives the substrate stage in accordance with drive information of the substrate stage in a period until exposure of the second shot region starts after an end of exposing the first shot region, and when an exposure condition for exposing the second shot region is not satisfied in the period, the control unit drives again the substrate stage in accordance with the drive information and then exposes the second shot region.

Further features of the present invention will become apparent from the following description of exemplary embodiments with reference to the attached drawings.

BRIEF DESCRIPTION OF THE DRAWINGS

FIG. 8 is a chart showing drive information of a substrate stage in an exposure apparatus according to the second embodiment; and FIG. 9 is a view for explaining driving of the substrate stage in the exposure apparatus according to the second embodiment.

DESCRIPTION OF THE EMBODIMENTS

Figure 1:
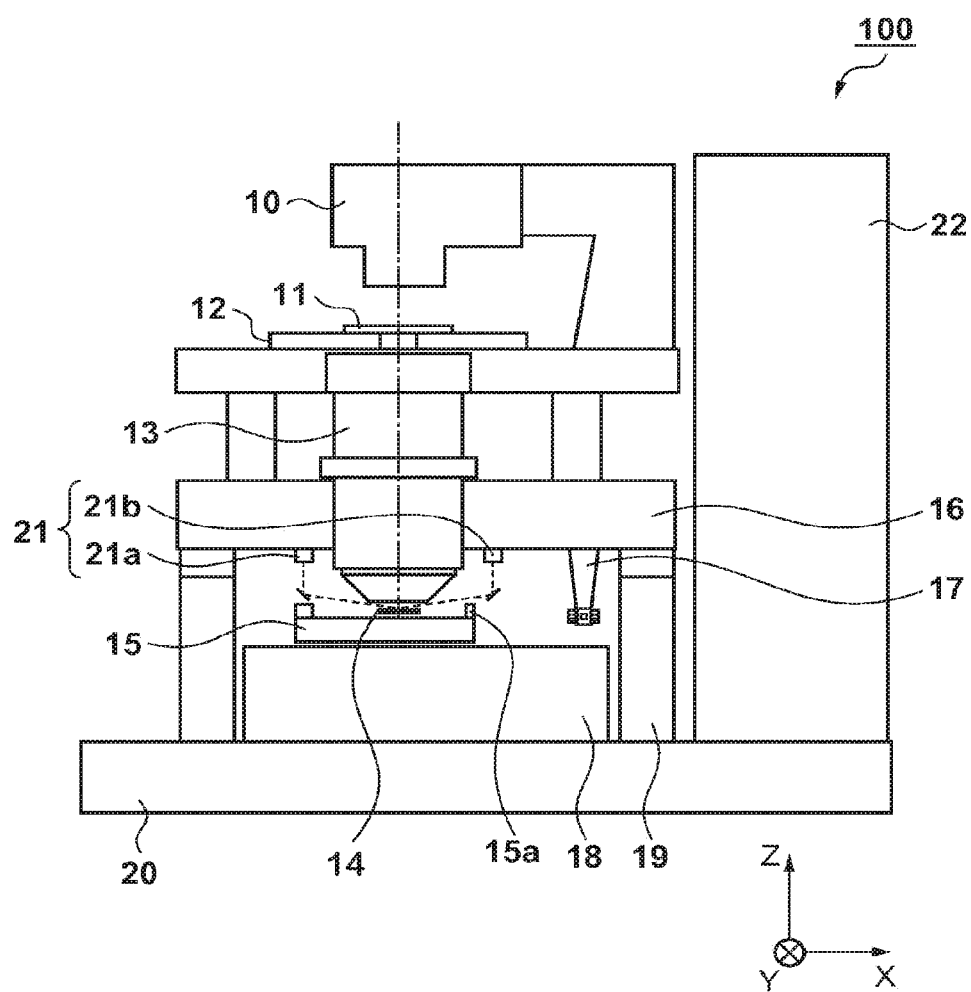
FIG. 1 is a view showing an exposure apparatus according to the first embodiment.

Exemplary embodiments of the present invention will be described below with reference to the accompanying drawings. Note that the same reference numerals denote the same members throughout the drawings, and a repetitive description thereof will not be given.

<First Embodiment>

An exposure apparatus 100 according to the first embodiment of the present invention will be described with reference to FIG. 1. FIG. 1 is a view showing the exposure apparatus 100 according to the first embodiment of the present invention. The exposure apparatus 100 according to the first embodiment is a step & scan type scanning exposure apparatus which scans and exposes a substrate with slit-shaped light. The exposure apparatus 100 includes an illumination optical system 10, mask stage 12, projection optical system 13, substrate stage 15, position measurement unit 17, focus measurement unit 21, and control unit 22. The control unit 22 includes a CPU and memory, and controls the overall exposure apparatus 100 (the respective units of the exposure apparatus 100). More specifically, the control unit 22 controls processing of transferring, onto a substrate 14, a pattern formed on a mask 11 (processing of scanning and exposing the substrate 14). The projection optical system 13 is supported by a structure 16. The structure 16 is supported via a column 19 by a base 20 fixed to the floor in order to suppress vibrations from the location (floor) where the exposure apparatus 100 is fixed. The substrate stage 15 is supported by the base 20 via a support table 18, and is configured to be movable in the X and Y directions on the support table 18.

The illumination optical system 10 shapes light emitted by a light source (not shown) into slit-shaped light having, for example, a band shape long in the X direction or a circular shape by using a light-shielding member such as a masking blade included in the illumination optical system 10. Then, the illumination optical system 10 illuminates part of the mask 11 with the slit-shaped light. The mask 11 and substrate 14 are held by the mask stage 12 and substrate stage 15, respectively, and are arranged at optically almost conjugate positions (object plane and image plane of the projection optical system 13) via the projection optical system 13. The projection optical system 13 has a predetermined projection magnification (for example, ½ or ¼), and projects, onto the substrate by slit-shaped light, the pattern formed on the mask 11. A region on the substrate where the pattern on the mask is projected (region irradiated with slit-shaped light) will be called an irradiation region 25 hereinafter. The mask stage 12 and substrate stage 15 are configured to be movable in a direction (Y direction in the first embodiment) perpendicular to the optical axis direction (Z direction) of the projection optical system 13. The mask stage 12 and substrate stage 15 are relatively scanned in synchronism with each other at a speed ratio corresponding to the projection magnification of the projection optical system 13. While scanning the irradiation region 25 in the Y direction on the substrate, the pattern formed on the mask 11 can be transferred to a shot region on the substrate. By sequentially repeating this scanning exposure for each of a plurality of shot regions on the substrate while moving the substrate stage 15, exposure processing on one substrate 14 can be completed.

The position measurement unit 17 includes, for example, a laser interferometer, and measures the position of the substrate stage 15. For example, the laser interferometer emits a laser beam toward a reflecting plate 15a of the substrate stage 15, and detects a displacement from a reference position on the substrate stage 15 based on the laser beam reflected by the reflecting plate 15a. Based on the displacement, the position measurement unit 17 can obtain the current position of the substrate stage 15. The position measurement unit 17 according to the first embodiment measures the position of the substrate stage 15 by the laser interferometer using a laser beam. However, the present invention is not limited to this, and the position of the substrate stage 15 may be measured by, for example, an encoder.

The focus measurement unit 21 measures the height of the substrate 14 while the substrate stage 15 is moving, in order to make the substrate surface coincide with the imaging plane (focus plane) of the projection optical system 13. The focus measurement unit 21 according to the first embodiment is an oblique incidence type in which the substrate 14 is irradiated with light obliquely. The focus measurement unit 21 includes an irradiation unit 21a which irradiates the substrate 14 with light, and a light-receiving unit 21b which receives light reflected by the substrate 14. The irradiation unit 21a includes, for example, a light source, projection mark, and optical system. The irradiation unit 21a irradiates a projection mark with light emitted by the light source, and forms the image of the projection mark on the substrate via the optical system. The light-receiving unit 21b includes, for example, an imaging optical system and sensor. The light-receiving unit 21b forms, on the sensor via the imaging optical system, the image of the projection mark reflected by the substrate 14. The sensor outputs, for example, information representing a position on the sensor at which the image of the projection mark is formed. Since the focus measurement unit 21 forms the image of the projection mark on the substrate 14 obliquely, a change of the height of the substrate 14 becomes a change of the imaging position on the sensor. The height of the substrate 14 can therefore be measured based on an output (information representing an imaging position on the sensor) from the sensor.

The exposure apparatus 100 having this arrangement needs to accurately transfer the pattern of the mask 11 onto the substrate. For this purpose, it is important to make the imaging plane (focus plane) of the projection optical system 13 coincide with the substrate surface. In the exposure apparatus 100, therefore, the focus measurement unit 21 performs focus measurement to measure the height of the substrate surface. However, since a reaction force is generated along with acceleration or deceleration of the substrate stage 15 in the exposure apparatus 100, the frame structure (for example, the structure 16) is deformed and thereby an error in the measurement result of focus measurement may be generated. As a result, the state of the pattern image projected on the substrate 14 via the projection optical system 13 may change. It may become difficult to accurately transfer the pattern of the mask 11 onto the substrate. To solve this problem, in the exposure apparatus 100, a correction value (offset value) for correcting the result of focus measurement, that is, the state of the pattern image is obtained in advance while driving the substrate stage 15 in accordance with drive information of the substrate stage 15 in exposure processing of the substrate 14. While correcting the state (result of focus measurement) of the pattern image projected on the substrate 14 by using the correction value obtained in advance, each of a plurality of shot regions 14a is exposed. The drive information of the substrate stage 15 represents the relationship between the acceleration of the substrate stage 15 and the time. The state of the pattern image projected on the substrate 14 is corrected by changing at least one of the height of the substrate 14, the height of the mask 11, and the projection magnification of the projection optical system 13.

Figure 2:
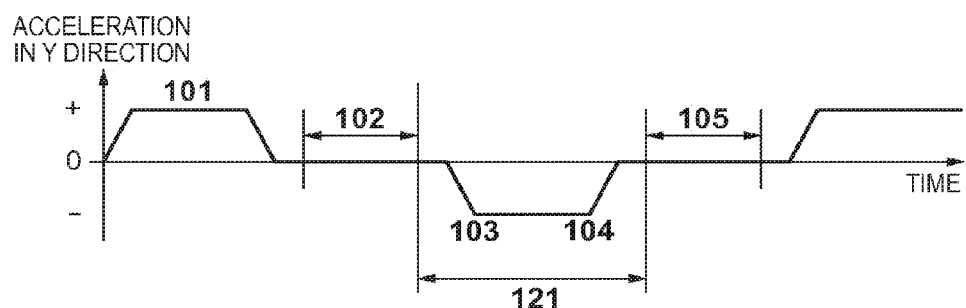
FIG. 2 is a chart showing drive information of a substrate stage in exposure processing.
Figure 3:
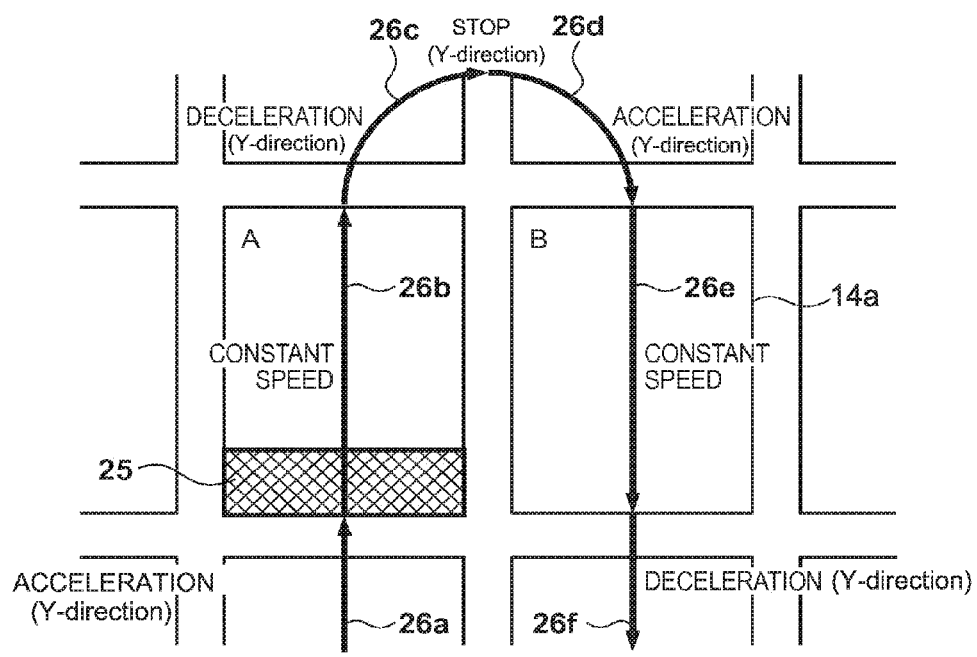
FIG. 3 is a view for explaining driving of the substrate stage in exposure processing.

Drive information of the substrate stage 15 in exposure processing will be explained with reference to FIGS. 2 and 3. FIG. 2 is a chart showing drive information of the substrate stage 15 when the substrate stage 15 is driven. FIG. 3 is a view for explaining driving of the substrate stage 15 in exposure processing. FIG. 3 shows a center path (an arrow 26) in the irradiation region 25. In FIG. 2, the abscissa indicates the time, and the ordinate indicates the acceleration of the substrate stage 15 in the Y direction. The plurality of shot regions 14a are formed on the substrate. When each shot region 14a is exposed, that is, when the irradiation region 25 exists in each shot region 14a, the (control unit 22 of) exposure apparatus 100 controls driving of the substrate stage 15 so that the substrate stage 15 moves at a constant speed. Driving of the substrate stage 15 in the Y direction in exposure processing of a shot region A (first shot region) and a shot region B (second shot region) to be exposed next, out of the plurality of shot regions 14a, will be explained below.

The control unit 22 gives an acceleration 101 in the +Y direction to the substrate stage 15, as shown in FIG. 2, until exposure of the shot region A starts, that is, until the irradiation region reaches the shot region A (an arrow 26a in FIG. 3). In response to this, the substrate stage 15 can be accelerated in the +Y direction to reach a predetermined speed. After the substrate stage 15 reaches the predetermined speed, the control unit 22 moves the substrate stage at a constant speed so that the irradiation region 25 scans the shot region A at a constant speed in the +Y direction (an arrow 26b in FIG. 3). The control unit 22 starts exposure of the shot region A when the irradiation region 25 reaches the shot region A, and ends the exposure of the shot region A when the irradiation region 25 leaves the shot region A. In FIG. 2, a time 102 is the time in which the shot region A is exposed. After the irradiation region 25 leaves the shot region A, the control unit 22 gives an acceleration 103 in the −Y direction to the substrate stage 15 to decelerate the substrate stage 15, as shown in FIG. 2 (an arrow 26c in FIG. 3). Even after the substrate stage 15 stops, the control unit 22 keeps giving an acceleration 104 in the −Y direction to the substrate stage 15 to accelerate the substrate stage 15 in the −Y direction (an arrow 26d in FIG. 3). Accordingly, the substrate stage 15 can reach a predetermined speed. After the substrate stage 15 reaches the predetermined speed, the control unit 22 moves the substrate stage 15 at a constant speed so that the irradiation region 25 scans the shot region B at a constant speed in the −Y direction (an arrow 26e in FIG. 3). The control unit 22 starts exposure of the shot region B when the irradiation region 25 reaches the shot region B, and ends the exposure of the shot region B when the irradiation region 25 leaves the shot region B. In FIG. 2, a time 105 is the time in which the shot region B is exposed.

While driving the substrate stage 15 in accordance with drive information configured as shown in FIG. 2, the exposure apparatus 100 according to the first embodiment obtains in advance a correction value for correcting the state of a pattern image projected on the substrate 14. While driving the substrate stage 15 in accordance with the drive information, the exposure apparatus 100 exposes each of the plurality of shot regions 14a. At this time, the state (result of focus measurement) of the pattern image projected on the substrate 14 is corrected by using the correction value obtained in advance. That is, the exposure apparatus 100 drives the substrate stage 15 in accordance with the same drive information when obtaining the correction value and when exposing each of the plurality of shot regions 14a.

In the exposure apparatus 100, an exposure condition for exposing the shot region B is being satisfied in a period until exposure of the shot region B (second shot region) starts after the end of exposing the shot region A (first shot region). That is, the exposure condition for exposing the shot region B is being satisfied in a period 121 in FIG. 2. An example of the exposure condition is whether shaping of slit-shaped light irradiating a shot region is completed, such as whether driving of the light-shielding member such as the masking blade included in the illumination optical system 10 is completed, or whether emission preparation of light in the light source is completed. Generally, the time taken to satisfy the exposure condition differs between the plurality of shot regions 14a. For example, in the period 121, the exposure condition for exposing the shot region B may not be satisfied. In this case, the exposure apparatus 100 does not expose the shot region B. However, to increase the yield, the exposure apparatus 100 needs to expose even the shot region B which has not been exposed because the exposure condition of the shot region B was not satisfied in the period 121. When the exposure condition of the shot region B was not satisfied in the period 121, the exposure apparatus 100 interrupts driving of the substrate stage 15 for exposing the shot region B. Then, the exposure apparatus 100 drives the substrate stage 15 to expose the unexposed shot region B. Driving of the substrate stage 15 when exposing the unexposed shot region B will be explained by comparing a conventional exposure apparatus with the exposure apparatus 100 according to the first embodiment.

Figure 4:
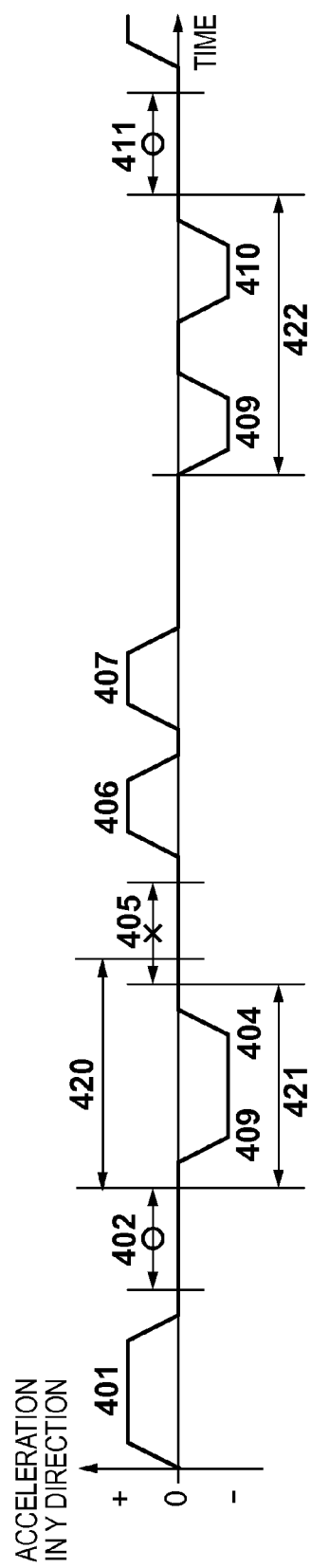
FIG. 4 is a chart showing drive information of a substrate stage in a conventional exposure apparatus.
Figure 5:
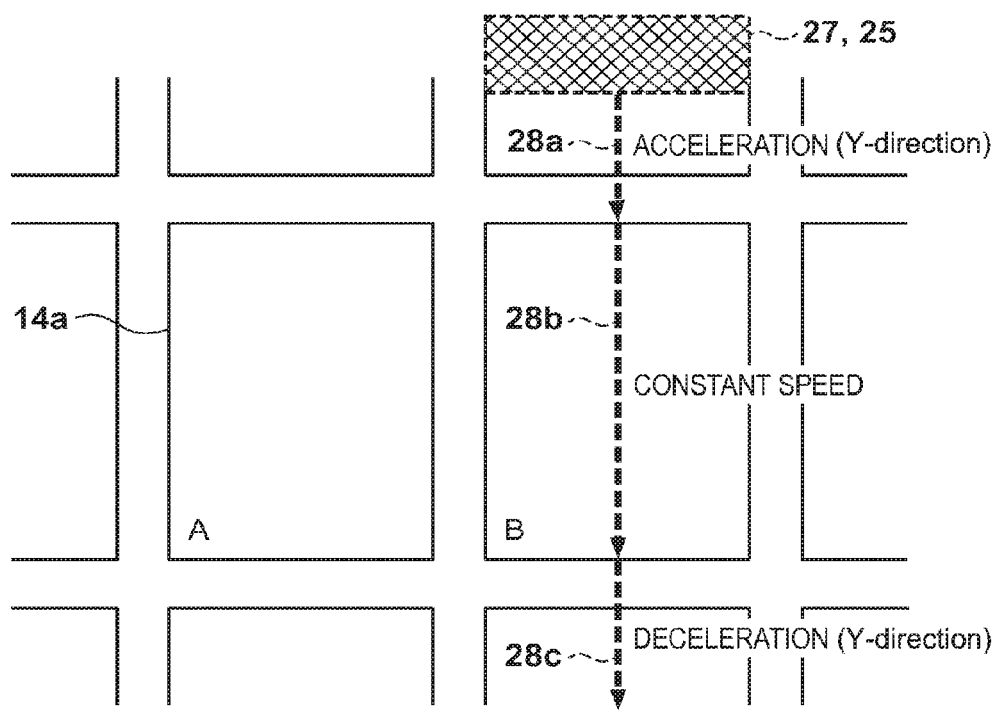
FIG. 5 is a view for explaining driving of the substrate stage in the conventional exposure apparatus.

Driving of the substrate stage 15 when exposing the unexposed shot region B in the conventional exposure apparatus will be explained with reference to FIG. 4. FIG. 4 is a chart showing drive information of the substrate stage 15 in the conventional exposure apparatus. In FIG. 4, the abscissa indicates the time, and the ordinate indicates the acceleration of the substrate stage 15 in the Y direction. Driving of the substrate stage 15 in exposure processing in the conventional exposure apparatus will be explained with reference to FIG. 3. The control unit 22 gives an acceleration 401 in the +Y direction to the substrate stage 15 until exposure of the shot region A starts, that is, until the irradiation region 25 reaches the shot region A (the arrow 26a in FIG. 3). In response to this, the substrate stage 15 can be accelerated in the +Y direction to reach a predetermined speed. After the substrate stage 15 reaches the predetermined speed, the control unit 22 moves the substrate stage 15 at a constant speed so that the irradiation region 25 scans the shot region A at a constant speed in the +Y direction (the arrow 26b in FIG. 3). The control unit 22 starts exposure of the shot region A when the irradiation region 25 reaches the shot region A, and ends the exposure of the shot region A when the irradiation region 25 leaves the shot region A. In FIG. 4, a time 402 is the time in which the shot region A is exposed. After the irradiation region 25 leaves the shot region A, the control unit 22 gives an acceleration 403 in the −Y direction to the substrate stage 15 to decelerate the substrate stage 15 (the arrow 26c in FIG. 3). Even after the substrate stage 15 stops, the control unit 22 keeps giving an acceleration 404 in the −Y direction to the substrate stage 15 to accelerate the substrate stage 15 in the −Y direction (the arrow 26d in FIG. 3). Accordingly, the substrate stage 15 can reach a predetermined speed (the arrow 26e in FIG. 3). However, in the example shown in FIG. 4, the exposure condition for exposing the shot region B is not satisfied in a period 421 until exposure of the shot region B starts after the end of exposing the shot region A. That is, a time 420 taken to satisfy the exposure condition of the shot region B becomes longer than the period 421, and the exposure apparatus cannot expose the shot region B in a time 405. The exposure apparatus needs to expose the unexposed shot region B. Thus, the conventional exposure apparatus arranges the irradiation region 25 at a position 27, and scans the irradiation region 25 from the position 27 in the −Y direction to expose the shot region B, as shown in FIG. 5.

After the irradiation region 25 leaves the shot region B without exposing the shot region B, the control unit 22 gives an acceleration 406 in the +Y direction to the substrate stage 15 to decelerate and stop the substrate stage 15 (an arrow 26f in FIG. 3). Then, the control unit 22 gives an acceleration 407 in the +Y direction to the substrate stage 15 to accelerate the substrate stage 15 in the +Y direction. Further, the control unit 22 gives an acceleration 409 in the −Y direction to the substrate stage 15 to decelerate and stop the substrate stage 15. By this operation, the irradiation region 25 can be arranged at the position 27. Thereafter, the control unit 22 gives an acceleration 410 in the −Y direction to the substrate stage 15 to accelerate the substrate stage 15 (an arrow 28a in FIG. 5). The substrate stage 15 reaches a predetermined speed to expose the shot region B (an arrow 28b in FIG. 5). In FIG. 4, a time 411 is the time in which the shot region B is exposed. In this manner, the conventional exposure apparatus arranges the irradiation region 25 at the position 27 and then exposes the shot region B.

However, when the irradiation region 25 is arranged at the position 27 and then the shot region B is exposed, as in the conventional exposure apparatus, drive information of the substrate stage 15 in the period 421 and drive information of the substrate stage 15 in a period 422 become different from each other. That is, drive information of the substrate stage 15 till the start of exposing the shot region B changes, and the deformation of the apparatus along with driving of the substrate stage 15 differs between the period 421 and the period 422. As a result, the state of a pattern image in the time 405 in which the shot region B should be exposed, and the state of a pattern image in the time 411 in which the shot region B was actually exposed become different. Hence, when exposing the shot region B in the time 411, even if the state of the pattern image is corrected by using a correction value obtained in advance, the correction may be insufficient, and it may become difficult to accurately transfer the pattern of the mask 11 onto the substrate.

Figure 6:
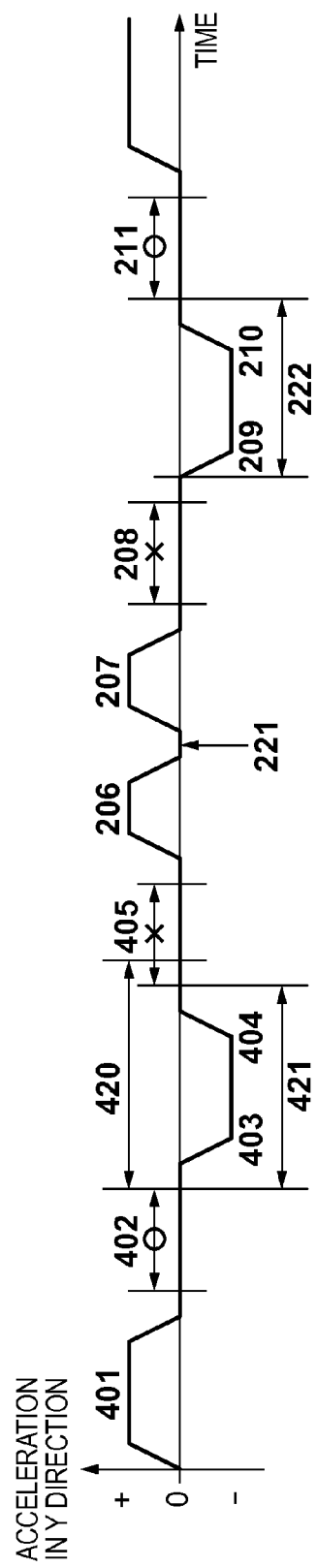
FIG. 6 is a chart showing drive information of a substrate stage in the exposure apparatus according to the first embodiment.
Figure 7:
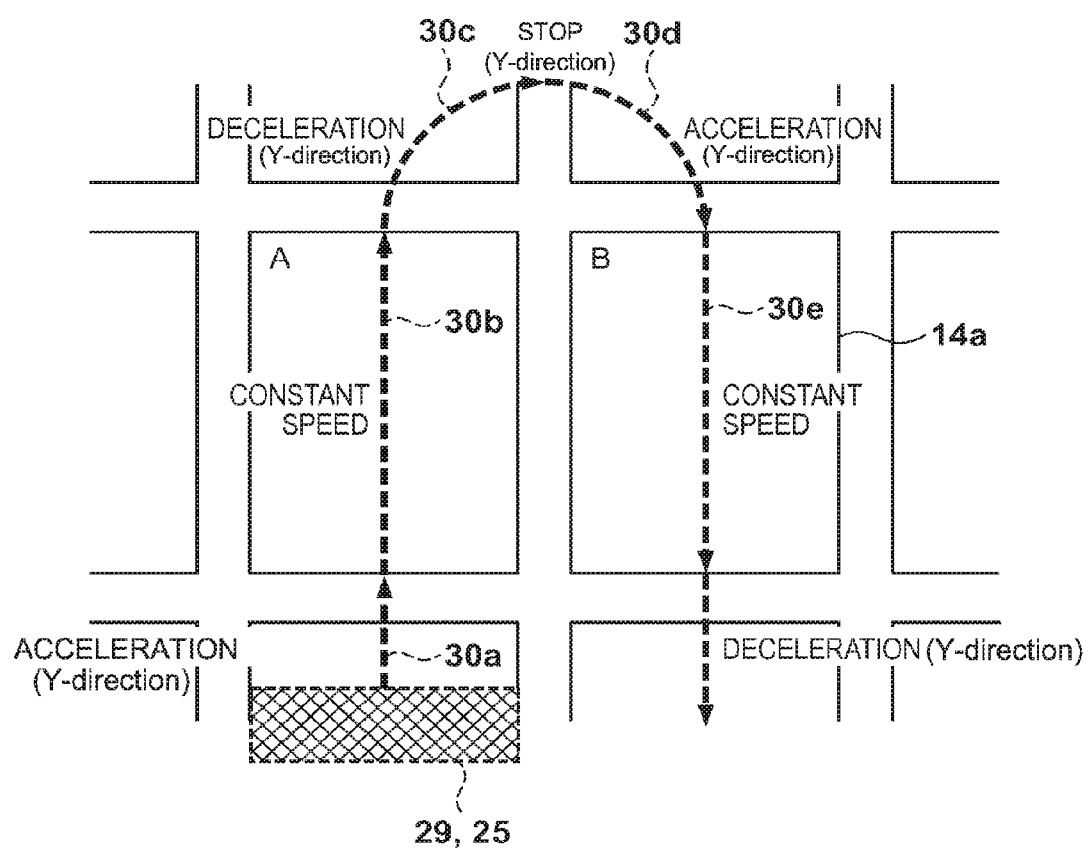
FIG. 7 is a view for explaining driving of the substrate stage in the exposure apparatus according to the first embodiment.

Next, driving of the substrate stage 15 when exposing the unexposed shot region B in the exposure apparatus 100 according to the first embodiment will be explained with reference to FIG. 6. FIG. 6 is a chart showing drive information of the substrate stage 15 in the exposure apparatus according to the first embodiment. In the exposure apparatus 100 according to the first embodiment, when exposing the unexposed shot region B, the irradiation region 25 is arranged at a position 29, as shown in FIG. 7. The control unit 22 drives again the substrate stage 15 in accordance with pieces of drive information of the substrate stage 15 in the time 402 in which the shot region A is exposed and in the period 421 till the start of exposing the shot region B after the end of exposing the shot region A. Then, the control unit 22 exposes the shot region B. After the time 405 in which the shot region B should be exposed, the control unit 22 gives an acceleration 206 in the +Y direction to the substrate stage 15 to decelerate the substrate stage 15 and move it in the −X direction. As a result, the irradiation region 25 is positioned at the position 29 at time 221.

After the irradiation region 25 is arranged at the position 29, the control unit 22 gives an acceleration 207 in the +Y direction to the substrate stage to accelerate the substrate stage 15 (an arrow 30a in FIG. 7). While keeping the substrate stage 15 at a predetermined speed, the control unit 22 controls the irradiation region 25 to pass the shot region A (an arrow 30b in FIG. 7). In FIG. 6, a time 208 is the time in which the irradiation region 25 passes the shot region A. Since the shot region A has been exposed in the time 402, the control unit 22 does not expose the shot region A in the time 208.

After the irradiation region 25 leaves the shot region A, the control unit 22 gives an acceleration 209 in the −Y direction to the substrate stage 15 to decelerate the substrate stage, as shown in FIG. 6 (an arrow 30c in FIG. 7). Even after the substrate stage 15 stops, the control unit 22 keeps giving an acceleration 210 in the −Y direction to the substrate stage 15 to accelerate the substrate stage 15 in the −Y direction (an arrow 30d in FIG. 7). Then, the control unit 22 controls the substrate stage 15 to reach a predetermined speed, and exposes the shot region B (an arrow 30e in FIG. 7). In FIG. 6, a time 211 is the time in which the shot region B is exposed. In this way, before exposing the shot region B which has not been exposed because the exposure condition was not satisfied, the exposure apparatus 100 according to the first embodiment drives again the substrate stage 15 in accordance with drive information of the substrate stage 15 in the period 421. Deformations of the apparatus along with driving of the substrate stage 15 in the period 421 and a period 222 can come close to each other. Hence, the state of a pattern image in the time 405 in which the shot region B should be exposed, and the state of a pattern image in the time 211 in which the shot region B was actually exposed can come close to each other. That is, the pattern of the mask 11 can be accurately transferred to the shot region B by correcting the state of the pattern image using a correction value obtained in advance when exposing the shot region B in the time 211.

As described above, in the exposure apparatus 100 according to the first embodiment, the shot region B is sometimes not exposed because the exposure condition was not satisfied in a period until exposure of the shot region B starts after the end of exposing the shot region A. In this case, the exposure apparatus 100 according to the first embodiment drives again the substrate stage in accordance with drive information of the substrate stage 15 in this period, and then exposes the shot region B. The state of a pattern image in the time in which the shot region B should be exposed, and the state of a pattern image in the time in which the shot region B was actually exposed can come close to each other. When exposing the unexposed shot region B, the state of the pattern image can be corrected by using a correction value obtained in advance. The pattern of the mask can be accurately transferred to the shot region B.

The exposure apparatus 100 according to the first embodiment exposes the shot region B after driving again the substrate stage 15 in accordance with pieces of drive information of the substrate stage 15 in the time 402 and period 421, as described with reference to FIGS. 6 and 7. However, the present invention is not limited to this. It is only necessary to, before exposing the shot region B, drive again the substrate stage in accordance with at least drive information of the substrate stage 15 in the period 421 till the start of exposing the shot region B after the end of exposing the shot region A. In the exposure apparatus 100 according to the first embodiment, the substrate stage 15 is driven to arrange the irradiation region 25 at the position 29 immediately after the end of scanning the shot region B by the irradiation region 25. However, the present invention is not limited to this. For example, after the irradiation region 25 scans all shot regions on the substrate, the substrate stage 15 may be driven to arrange the irradiation region 25 at the position 29. Further, in the first embodiment, it is desirable to drive again even the mask stage 12 in accordance with pieces of drive information of the mask stage 12 in the time 402 and period 421 when the substrate stage 15 is driven again in accordance with drive information of the substrate stage 15.

<Second Embodiment>

The second embodiment will explain a method of exposing a shot region which has not been exposed because the exposure condition was not satisfied in a step & repeat exposure apparatus. The step & repeat exposure apparatus does not drive a substrate stage 15 when exposing a shot region 14a, and exposes the shot region 14a in a state in which the substrate stage 15 is stopped. In the exposure apparatus according to the second embodiment, an irradiation region 25 irradiated with light on a substrate becomes equal in size to the shot region 14a. The arrangement of the exposure apparatus according to the second embodiment is the same as that of the exposure apparatus 100 according to the first embodiment, and a description thereof will not be repeated.

Drive information of the substrate stage 15 in exposure processing in the exposure apparatus according to the second embodiment will be explained with reference to FIGS. 8 and 9. FIG. 8 is a chart showing drive information of the substrate stage 15 when the substrate stage 15 is driven. FIG. 9 is a view for explaining driving of the substrate stage 15 in exposure processing. FIG. 9 shows a center path in the irradiation region 25. In the exposure apparatus according to the second embodiment, a correction value for correcting the state of a pattern image projected on a substrate 14 is obtained after a predetermined time 600 elapses from the stop of the substrate stage 15.

A control unit 22 gives an acceleration 601 in the +Y direction to the substrate stage 15 to accelerate the substrate stage 15 (an arrow 30*a*in FIG. 9). Then, the control unit 22 gives an acceleration 602 in the −Y direction to the substrate stage 15 to decelerate the substrate stage 15 (an arrow 30*b*in FIG. 9) and stop it. By this operation, the irradiation region 25 is arranged in a shot region A. After the exposure condition of the shot region A is satisfied, and the predetermined time 600 (a settling time 621) elapses from the stop of the substrate stage 15, the control unit 22 exposes the shot region A. In FIG. 8, a time 611 is the time in which the exposure condition of the shot region A is being satisfied. A time 612 is the time in which the shot region A is exposed. After the end of exposing the shot region A, the control unit 22 gives an acceleration 603 in the +Y direction to the substrate stage 15 to accelerate the substrate stage 15 (an arrow 30*c*in FIG. 9). The control unit 22 gives an acceleration 604 in the −Y direction to the substrate stage 15 to decelerate the substrate stage 15 (an arrow 30*d*in FIG. 9) and stop it. The irradiation region 25 is therefore arranged in a shot region B. After the exposure condition of the shot region B is satisfied and the predetermined time 600 elapses from the stop of the substrate stage 15, the control unit 22 exposes the shot region B. In FIG. 8, a time 613 is the time in which the exposure condition of the shot region B is being satisfied. A time 614 is the time in which the shot region B should be exposed.

However, as shown in FIG. 8, the end time of the time 613 in which the exposure condition of the shot region B is being satisfied is later than the end time of the predetermined time 600. In other words, a settling time 622 of the substrate stage 15 before exposing the shot region B becomes longer than the predetermined time 600. If the shot region B is exposed in the time 614 after the settling time 622, the state of a pattern image upon obtaining a correction value, and the state of a pattern image in the time 614 differ from each other. To prevent this, the control unit 22 stops exposure of the shot region B in the time 614, and gives an acceleration 605 in the −Y direction to the substrate stage 15. Then, the control unit 22 gives an acceleration 606 in the +Y direction to the substrate stage to arrange the irradiation region 25 in the shot region A at time 624. The control unit 22 gives an acceleration 607 in the +Y direction to the substrate stage to accelerate the substrate stage 15 in the +Y direction so that the irradiation region 25 is arranged in the shot region B (the arrow 30*c*in FIG. 9). The control unit 22 gives an acceleration 608 in the −Y direction to the substrate stage 15 to decelerate the substrate stage 15 in the −Y direction (the arrow 30*d*in FIG. 9) and stop it. After the predetermined time 600 (a settling time 623) elapses from the stop of the substrate stage 15, the control unit 22 exposes the shot region B. Accordingly, the state of a pattern image in a time 615 in which the shot region B is exposed can come close to the state of a pattern image upon obtaining a correction value. The pattern of the mask can be accurately transferred to the shot region B by correcting the state of the pattern image using a correction value obtained in advance when exposing the shot region B in the time 615.

As described above, in the exposure apparatus according to the second embodiment, the exposure condition of the shot region B is sometimes not satisfied in a period until exposure of the shot region B starts after the end of exposing the shot region A. In this case, the exposure apparatus according to the second embodiment drives again the substrate stage 15 in accordance with drive information of the substrate stage 15 in this period, and then exposes the shot region B. The settling time before exposing the substrate stage 15 can become equal to the predetermined time 600. When exposing the shot region B, the state of the pattern image can be corrected using a correction value obtained in advance. Therefore, the pattern of the mask can be accurately transferred to the shot region.

<Embodiment of Method of Manufacturing Article>

A method of manufacturing an article according to the embodiment of the present invention is suitable for manufacturing an article such as a microdevice (for example, a semiconductor device) or an element having a microstructure. The method of manufacturing an article according to the embodiment includes a step of forming a latent image pattern on a photosensitive agent applied to a substrate by using the above-described scanning exposure apparatus (a step of exposing a substrate), and a step of developing the substrate on which the latent image pattern is formed in the preceding step. Further, this manufacturing method includes other well-known steps (for example, oxidization, deposition, vapor deposition, doping, planarization, etching, resist removal, dicing, bonding, and packaging). The method of manufacturing an article according to the embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-122024 filed on Jun. 10, 2013, which is hereby incorporated by reference herein in its entirety.

What is claimed is:

1. An exposure apparatus which exposes each of a first shot region and a second shot region on a substrate, comprising:
a substrate stage configured to be movable while holding the substrate;
a projection optical system configured to project, onto the substrate, a pattern formed on a mask; and
a control unit configured to perform control of driving the substrate stage after exposing the first shot region, and then exposing the second shot region in a state where an exposure condition for exposing the second shot region is satisfied,
wherein the control unit controls exposing the second shot region while correcting a state of a pattern image, which is projected on the substrate by the projection optical system, in accordance with a correction value obtained in advance by driving the substrate stage based on acceleration information of the substrate stage in a direction perpendicular to an optical axis of the projection optical system, cancels exposing the second shot region in a case where the exposure condition is not satisfied while driving the substrate stage from an end position of exposing the first shot region to a start position of exposing the second shot region based on the acceleration information, and then performs exposing the second shot region in a state where the exposure condition is satisfied after driving again the substrate stage from the end position to the start position based on the acceleration information.

2. The apparatus according to claim 1, wherein the control unit corrects the state of the pattern image by changing at least one of a height of the substrate, a height of the mask, and a projection magnification of the projection optical system.

3. The apparatus according to claim 1, wherein the state where the exposure condition is satisfied includes a state where shaping of light irradiating the second shot region is completed.

4. The apparatus according to claim 1, wherein the exposure apparatus performs exposing of a shot region by scanning, on the substrate, an irradiation region formed by light for exposing the substrate.

5. A method of manufacturing an article, the method comprising:
   exposing a substrate using an exposure apparatus;
   developing the exposed substrate; and
   processing the developed substrate to manufacture the article,
   wherein the exposure apparatus exposes each of a first shot region and a second shot region on the substrate, and includes:
      a substrate stage configured to be movable while holding the substrate;
      a projection optical system configured to project, onto the substrate, a pattern formed on a mask; and
      a control unit configured to perform control of driving the substrate stage after exposing the first shot region, and then exposing the second shot region in a state where an exposure condition for exposing the second shot region is satisfied,
   wherein the control unit controls exposing the second shot region while correcting a state of a pattern image, which is projected on the substrate by the projection optical system, in accordance with a correction value obtained in advance by driving the substrate stage based on acceleration information of the substrate stage in a direction perpendicular to an optical axis of the projection optical system, cancels exposing the second shot region in a case where the exposure condition is not satisfied while driving the substrate stage from an end position of exposing the first shot region to a start position of exposing the second shot region based on the acceleration information, and then performs exposing the second shot region in a state where the exposure condition is satisfied after driving again the substrate stage from the end position to the start position based on the acceleration information.

6. An exposure apparatus which exposes each of a first shot region and a second shot region on a substrate, comprising:
   a substrate stage configured to be movable while holding the substrate; and
   a control unit configured to perform control of driving the substrate stage after exposing the first shot region, and then exposing the second shot region in a state where an exposure condition for exposing the second shot region is satisfied,
   wherein the control unit cancels exposing the second shot region in a case where the exposure condition is not satisfied while driving the substrate stage from an end position of exposing the first shot region to a start position of exposing the second shot region based on drive information of the substrate stage, and then performs exposing the second shot region in a state where the exposure condition is satisfied after driving again the substrate stage from the end position to the start position based on the drive information.

7. The apparatus according to claim 6, wherein the drive information includes information representing a relationship between an acceleration of the substrate stage and time.

8. The apparatus according to claim 6, wherein the state where the exposure condition is satisfied includes a state where shaping of light irradiating the second shot region is completed.

9. The apparatus according to claim 6, wherein the exposure apparatus performs exposing a shot region by scanning, on the substrate, an irradiation region formed by light for exposing the substrate.

10. The apparatus according to claim 9, wherein the drive information includes information representing a relationship between an acceleration of the substrate stage in a scanning direction of the irradiation region and time.

11. A method of manufacturing an article, the method comprising:
    exposing a substrate using an exposure apparatus;
    developing the exposed substrate; and
    processing the developed substrate to manufacture the article,
    wherein the exposure apparatus exposes each of a first shot region and a second shot region on a substrate, and includes:
       a substrate stage configured to be movable while holding the substrate; and
       a control unit configured to perform control of driving the substrate stage after exposing the first shot region, and then exposing the second shot region in a state where an exposure condition for exposing the second shot region is satisfied,
    wherein the control unit cancels exposing the second shot region in a case where the exposure condition is not satisfied while driving the substrate stage from an end position of exposing the first shot region to a start position of exposing the second shot region based on drive information of the substrate stage, and then performs exposing the second shot region in a state where the exposure condition is satisfied after driving again the substrate stage from the end position to the start position based on the drive information.

12. An exposure method of exposing each of a first shot region and a second shot region on a substrate held by a movable substrate stage, the method comprising:
    driving the substrate stage after exposing the first shot region; and
    exposing the second shot region in a state where an exposure condition for exposing the second shot region is satisfied,
    wherein in a case where the exposure condition is not satisfied while driving the substrate stage from an end position of exposing the first shot region to a start position of exposing the second shot region based on drive information of the substrate stage, exposing the second shot region is canceled, and then exposing the second shot region is performed in a state where the exposure condition is satisfied after driving again the substrate stage from the end position to the start position based on the drive information.

13. The method according to claim 12, wherein the drive information includes information representing a relationship between an acceleration of the substrate stage and time.

14. The method according to claim 12, wherein the state where the exposure condition is satisfied includes a state where shaping of light irradiating the second shot region is completed.

15. The method according to claim 12, wherein a shot region on the substrate is exposed by scanning, on the substrate, an irradiation region formed by light for exposing the substrate.

16. The method according to claim 15, wherein the drive information includes information representing a relationship between an acceleration of the substrate stage in a scanning direction of the irradiation region and time.

17. A method of manufacturing an article, the method comprising:
   exposing a substrate using an exposure method;
   developing the exposed substrate; and
   processing the developed substrate to manufacture the article,
   wherein the exposure method includes a method of exposing each of a first shot region and a second shot region on a substrate held by a movable substrate stage, including:
   driving the substrate stage after exposing the first shot region; and
   exposing the second shot region in a state where an exposure condition for exposing the second shot region is satisfied,
   wherein in a case where the exposure condition is not satisfied while driving the substrate stage from an end position of exposing the first shot region to a start position of exposing the second shot region based on drive information of the substrate stage, exposing the second shot region is canceled, and then exposing the second shot region is performed in a state where the exposure condition is satisfied after driving again the substrate stage from the end position to the start position based on the drive information.

* * * * *